United States Patent
Chen et al.

(10) Patent No.: US 8,296,695 B1
(45) Date of Patent: Oct. 23, 2012

(54) METHOD AND APPARATUS FOR PERFORMING FAST INCREMENTAL RESYNTHESIS

(75) Inventors: Doris Tzu Lang Chen, Toronto (CA); Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 88 days.

(21) Appl. No.: 12/802,673

(22) Filed: Jun. 11, 2010

(51) Int. Cl.
*G06F 17/50* (2006.01)

(52) U.S. Cl. ........ 716/103; 716/104; 716/107; 716/111; 716/132; 703/16

(58) Field of Classification Search .......... 716/103, 716/104, 107, 111, 132; 703/16
See application file for complete search history.

(56) References Cited

U.S. PATENT DOCUMENTS

| | | | | |
|---|---|---|---|---|
| 5,805,861 A * | 9/1998 | Gilbert et al. | | 703/15 |
| 5,875,112 A * | 2/1999 | Lee | | 716/107 |
| 6,223,330 B1 * | 4/2001 | Risler | | 716/119 |
| 6,453,454 B1 * | 9/2002 | Lee et al. | | 716/102 |
| 6,530,073 B2 * | 3/2003 | Morgan | | 716/102 |
| 6,651,235 B2 * | 11/2003 | Dai et al. | | 716/55 |
| 6,941,540 B2 * | 9/2005 | Kumagai | | 716/102 |
| 8,141,028 B2 * | 3/2012 | Herzl et al. | | 716/139 |
| 8,176,452 B2 * | 5/2012 | Pandey et al. | | 716/105 |
| 2002/0162086 A1 * | 10/2002 | Morgan | | 716/18 |
| 2006/0136855 A1 * | 6/2006 | Hoff et al. | | 716/11 |
| 2007/0028204 A1 * | 2/2007 | Takeda | | 716/18 |
| 2007/0271537 A1 * | 11/2007 | Budumuru | | 716/5 |
| 2011/0055792 A1 * | 3/2011 | Pandey et al. | | 716/131 |
| 2011/0093825 A1 * | 4/2011 | Baumgartner et al. | | 716/108 |
| 2011/0113399 A1 * | 5/2011 | Vujkovic et al. | | 716/129 |
| 2011/0209113 A1 * | 8/2011 | Rahmat et al. | | 716/133 |
| 2011/0258587 A1 * | 10/2011 | Nikitin et al. | | 716/103 |

* cited by examiner

*Primary Examiner* — Phallaka Kik
(74) *Attorney, Agent, or Firm* — L. Cho

(57) ABSTRACT

A method for designing a system on a target device is disclosed. A first netlist with a first set of functionally invariant boundaries (FIBs) is generated after performing extraction during synthesis of a first version of the system in a first compilation. One or more of the FIBs is invalidated from the first set after performing optimizations during synthesis in the first compilation resulting in a second netlist with a second set of FIBs. A third netlist with a third set of FIBs is generated after performing extraction during synthesis of a second version of the system having a changed portion in a second compilation. Connectivity of matching nodes from the first netlist and the third netlist reaching FIBs is traversed to identify equivalent nodes associated with identical regions. The identical region in the third netlist is replaced with an optimized synthesized region from the second netlist.

35 Claims, 22 Drawing Sheets

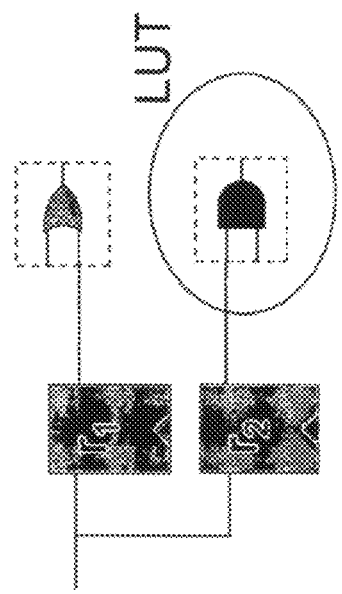
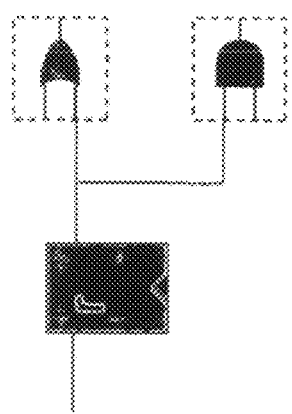
FIG. 5B
Extraction Netlist From 2nd Compilation With Synthesized Optimizations From 1st Compilation
Extraction Netlist From 2nd Compilation

EXTRACTION NETLIST DURING FIRST COMPILATION

SYNTHESIZED OPTIMIZATION DURING FIRST COMPILATION

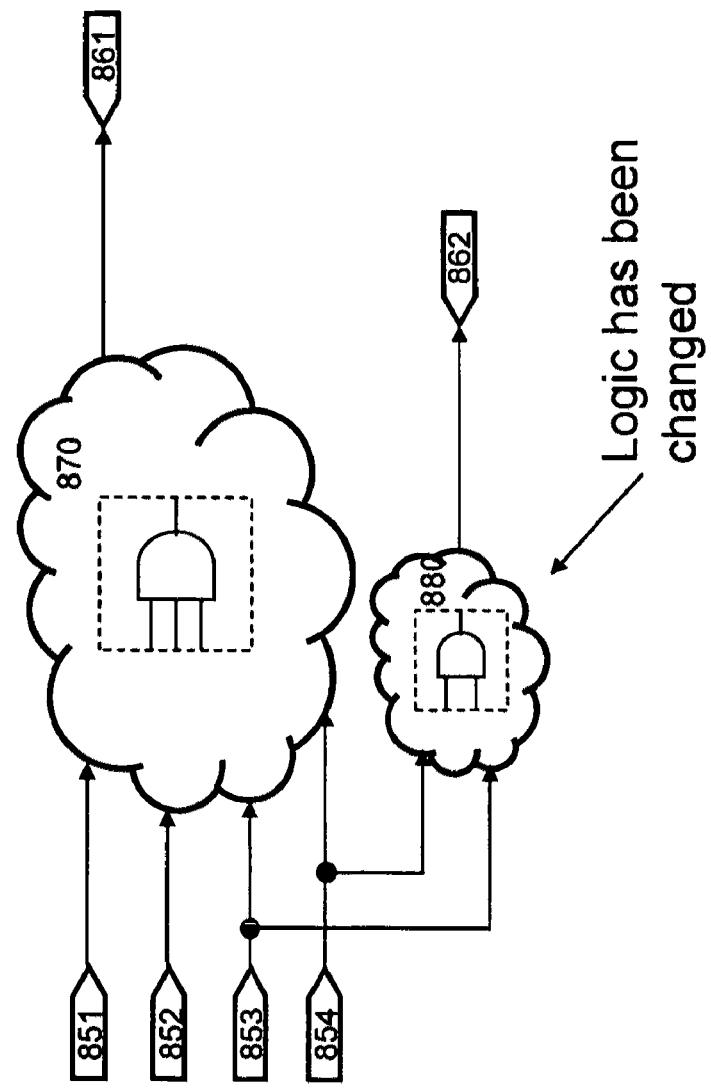

METHOD AND APPARATUS FOR PERFORMING FAST INCREMENTAL RESYNTHESIS

FIELD

Embodiments of the present invention relate to tools for designing systems on target devices. More specifically, embodiments of the present invention relate to a method and apparatus for performing fast incremental resynthesis.

BACKGROUND

Target devices such as field programmable gate arrays (FPGAs), structured application specific integrated circuits (ASICs), and ASICs are used to implement large systems that may include million of gates and megabits of embedded memory. The complexity of large systems often requires the use of electronic design automation (EDA) tools to create and optimize a design for the system onto physical target devices. Among the procedures performed by EDA tools in a computer aided design (CAD) flow are synthesis, placement, and routing. When designing large systems to be implemented on large target devices, EDA tools may require a large amount of time to perform these compilation procedures.

When making changes to large systems, it is typically more common for designers to modify localized portions of a design rather than making radical changes to large portions of the system. When making such localized changes, it is undesirable to have to invest a large amount of time to re-compile the entire system which would include the unmodified portions of the design. It is also undesirable to have the EDA tool process the entire system from scratch because the designer may be satisfied with the results of unmodified portions of the system and re-processing the unmodified portions may change achieved timing results unfavorably due to the heuristic nature of CAD algorithms. This may result in requiring additional design iterations to be performed to achieve timing closure which could be costly.

BRIEF DESCRIPTION OF THE DRAWINGS

The features and advantages of embodiments of the present invention are illustrated by way of example and are not intended to limit the scope of the embodiments of the present invention to the particular embodiments shown.

FIGS. 5A and 5B illustrate an example of how register duplication is addressed according to an embodiment of the present invention.

FIGS. 8A-8H illustrate an example of performing fast incremental resynthesis according to an embodiment of the present invention.

SUMMARY

According to an embodiment of the present invention, a method and apparatus for performing fast incremental resynthesis is disclosed that reuses synthesis results from a previous compilation to minimize the amount of logic that needs to be synthesized to reduce runtime. The structure of unchanged logic is preserved to provide timing closure. The method and apparatus disclosed also addresses sequential synthesis transformations such as register retiming, duplication, and merging that may be performed after extraction and during optimization of the previous compilation. Furthermore, the method and apparatus disclosed may use place and route timing information from the previous compilation to guide the synthesis of changed regions of logic during a subsequent compilation to improve timing closure.

According to an embodiment of the present invention, when a designer makes a change to the original system design from the previous compilation, a difference in the netlist structure in the modified system design is determined after extraction in synthesis. For regions of the netlist that have not changed, optimized synthesis results from the previous compilation are reused. In the subsequent compilation, optimizations will only be applied to areas of the netlist that have changed.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
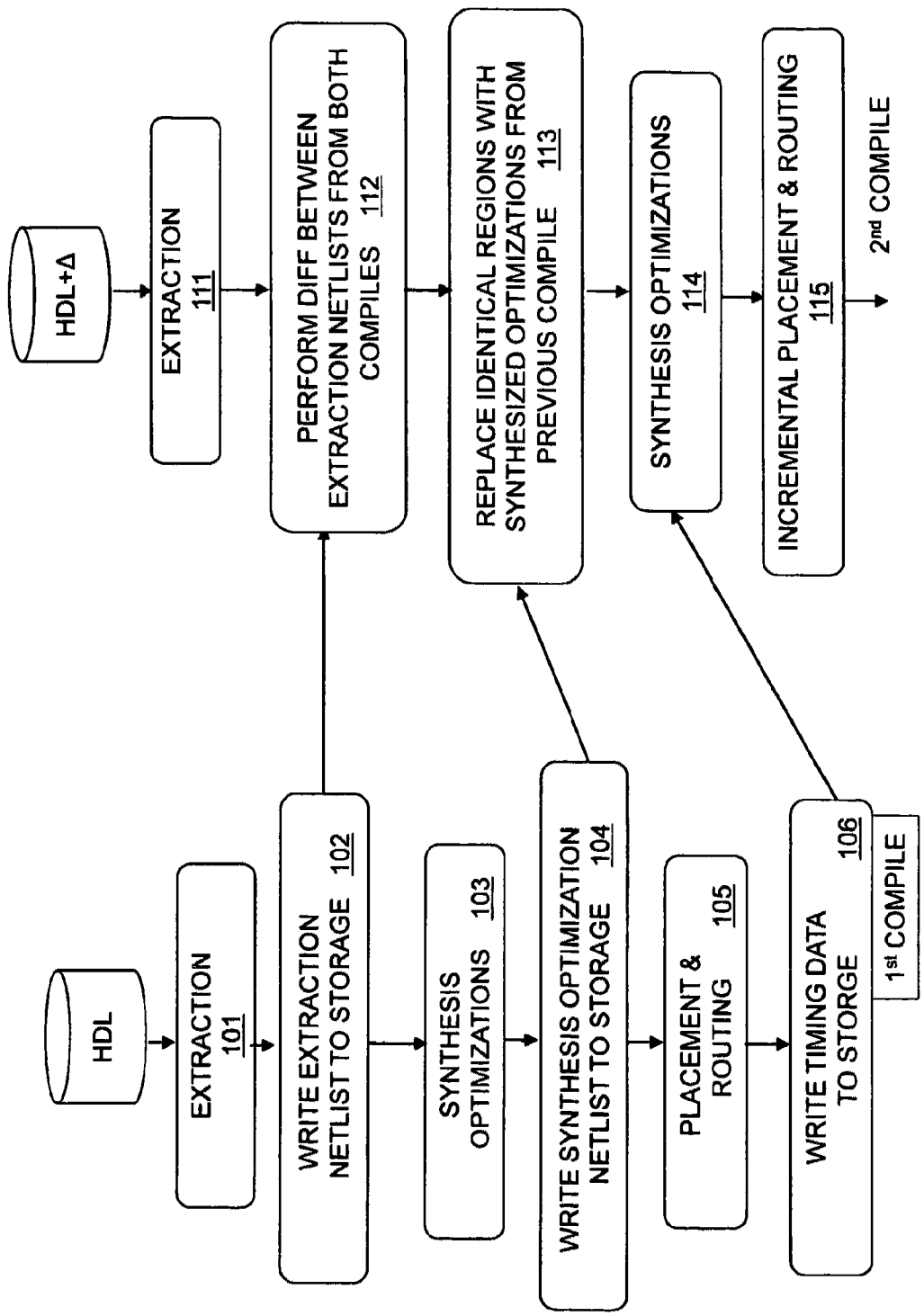
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be a field programmable gate array (FPGA), application specific integrated circuit (ASIC), a structured ASIC, or other device. According to one embodiment, the procedure illustrated in FIG. 1 may be performed by a computer aided design (CAD)/electronic design automation (EDA) tool implemented on a computer system. Procedures 101-106 describe a first compilation of a first or an initial design for a system. At 101, extraction, a first stage of synthesis, is performed on a first design of the system to create an initial structural representation of the system. According to an embodiment of the present invention, extraction includes generating a logical representation of the system from a high level description (HDL) of the system. The high level description of the system may be in the form of schematics, VHDL, Verilog or other design definition. The logical representation may include a representation that includes structural components such as functional blocks and registers ("components"), such as logic gates and logic elements, required for the system. According to an embodiment of the present invention, initial optimizations may also be performed during extraction. These initial optimizations may include the cleanout of netlists and constant propagation. An extraction netlist is created during extraction.

At 102, the extraction netlist created is written into storage.

At 103, optimizations are performed on the extraction netlist to reduce area and to improve speed of the system. The optimizations may include performing procedures such as high level logic synthesis of adders, multiplexers and state machines, lower level multi level synthesis optimizations that operate on combinational gates and registers, and technology mapping to create a netlist of blocks that are supported by the resources available on the target device. It should be appreciated that the lower level multi level synthesis optimizations may include sequential synthesis transformations such as register retiming, duplication, and merging. A synthesis optimizations netlist is created during synthesis optimizations. The optimization performed on the extraction netlist creates optimized synthesized regions.

At 104, the synthesis optimizations netlist is written to storage.

At 105, components in the mapped logical system design are placed and routed. Placement works on the synthesis optimizations netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

During routing, routing resources on the target device are allocated to provide interconnections between logic gates, logic elements, and other components on the target device. Routability optimization may also be performed on the placed logic design. According to an embodiment of the present invention, the goal of mutability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 106, timing data derived from the placement and routing of the first design of the system is written to storage.

Procedures 111-115 describe a subsequent or second design for a system. In this second design, changes are made to the HDL compiled by the first compilation. The changes may be made by a designer or other system design tool. At 111, extraction is performed on the second design of the system to create an initial structural representation of the system. According to an embodiment of the present invention, the second design of the system includes one or more changes to the first design of the system. The extraction procedure at 111 may be similar to the extraction procedure described with reference to procedure 101. An extraction netlist is created during extraction.

At 112, a differentiation procedure is performed between the extraction netlist for the first design created from the first compilation at 101 and the extraction netlist for the second design created from the second compilation at 111. The differentiation procedure identifies equivalent nodes in the subsequent compilation. According to an embodiment of the present invention, the differentiation procedure examines the structural qualities of the nodes in the netlists. A mapping may also be generated between extraction netlist and the synthesis optimization netlist from the first compilation.

At 113, identical regions in the extraction netlist from the second compilation are replaced with synthesis optimization implementations from the first compilation.

At 114, optimizations are performed on regions in the extraction netlist that have changed. The optimizations performed reduce area and improve speed of the system. The synthesis optimizations procedure at 114 may be similar to the synthesis optimizations procedure described with reference to procedure 103. According to an embodiment of the present invention, timing information from the placement and routing of the first design of the system from the first compile is used to compute an approximation of the amount of routing delay that will be required for changed logic in the second design of the system. For example, the routing delay necessary to traverse between functionally invariant boundaries may be used to generate an estimate. Given the timing constraint for the design/clock domain and the routing delay of the path, an upper bound on the amount of logic delay that can be added to paths in the second design of the system may be derived. A synthesis optimizations netlist is created for the second design of the system during synthesis optimizations.

At 115, incremental placement and routing is performed. According to an embodiment of the present invention, incremental placement and routing involves utilizing the placement and routing solutions generated from 105 for regions of the second design of the system that are identical to the first design of the system. For changed regions in the second design for the system, the changed regions are placed utilizing the procedures described with reference to procedure 105.

It should be appreciated that an assembly procedure may be performed after placement and routing 105 and/or incremental placement and routing 115. The assembly procedure involves creating a data file that includes information determined by the compilation procedure described by 101-105 and/or 111-115. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

According to an embodiment of the present invention, when performing extraction at 101 and 111, a set of functionally invariant boundaries (FIBs) are identified. FIBs have the property of being nodes in a netlist that do not change. According to one aspect of the invention, optimizations are performed between the FIBS and not across them. The FIBs can be registers, input output pins, carry chains, digital signal processors, memories, look up tables, or other components. According to an embodiment of the present invention, all the nodes in the extraction netlist generated at 101 and 111 are initially designated as FIBs.

When performing synthesis optimizations at 104, the set of FIBs identified at 101 are updated. According to an embodiment of the present invention, when optimizations are performed on or across a FIB, that FIB is invalidated. Also, when a group of FIBs are technology mapped to a resource on the target device, all of the FIBs in the group with the exception of the FIB closest to the output are invalidated.

Figure 2:
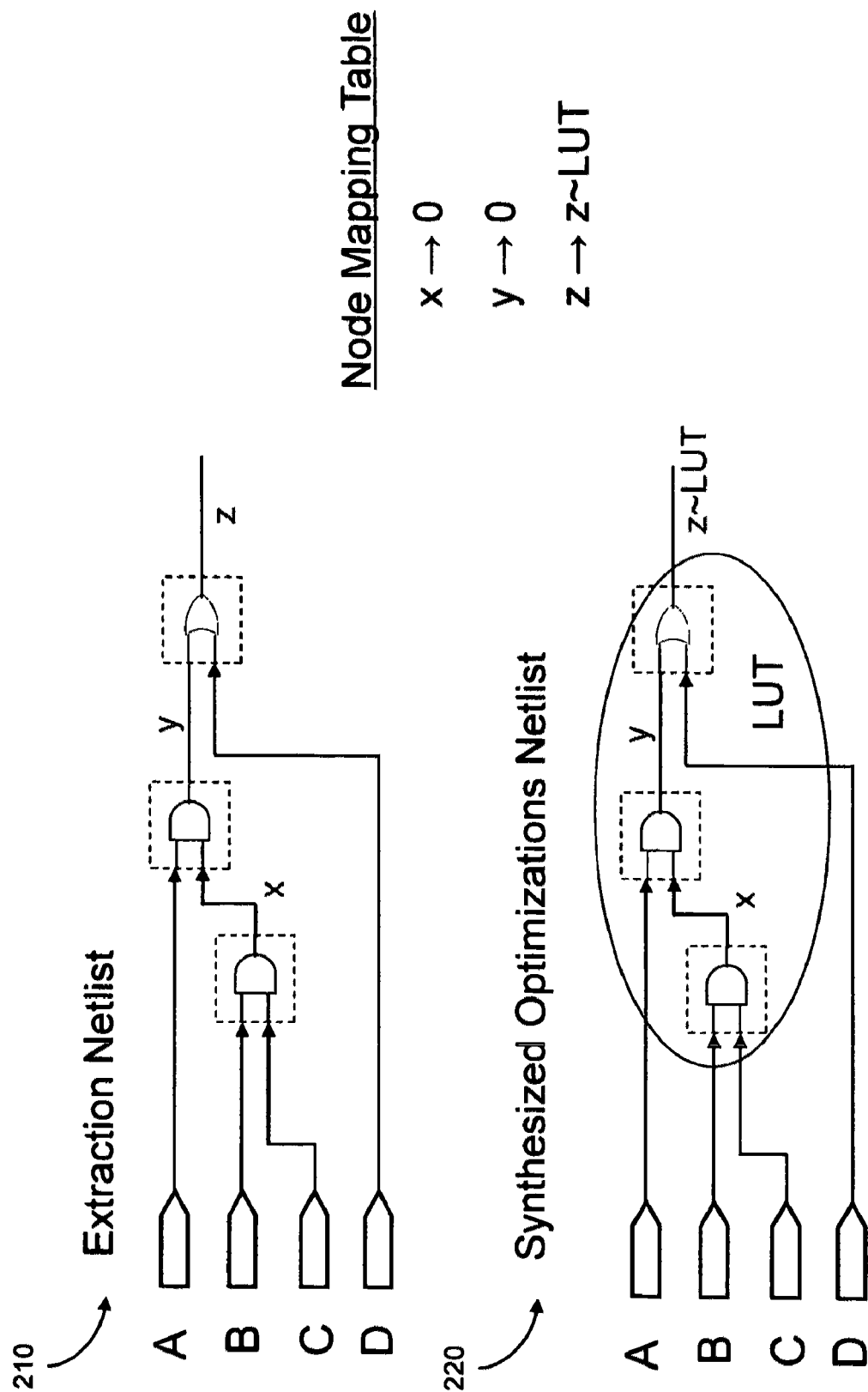
FIG. 2 illustrates an example of boundary changes according to an embodiment of the present invention.

FIG. 2 illustrates an example of a boundary change according to an embodiment of the present invention. Extracted netlist 210 illustrates a portion of a system after extraction is performed. The portion of the system includes logic gates X, Y, and Z, which are designated as FIBs. Synthesized optimizations netlist 220 illustrates the same portion of the system after synthesis optimizations are preformed. After synthesis optimizations are performed, logic gates X, Y, and Z are technology mapped into a LUT. As a result, logic gates X and Y are invalidated as FIBs, and the LUT that includes logic gates X, Y, and Z is re-mapped to the FIB previously associated with Z. This updating of the set of FIBs is reflected in the Node Mapping Table shown.

Figure 3:
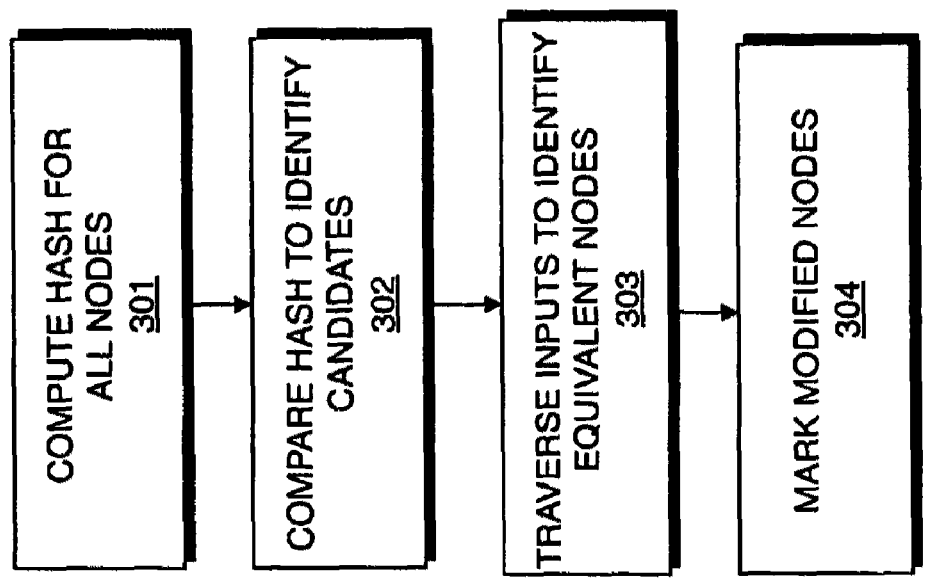
FIG. 3 is a flow chart illustrating a method for performing a differentiation between extraction netlists from different compilation according to an exemplary embodiment of the present invention.

FIG. 3 is a flow chart illustrating a method for performing a differentiation between extraction netlists from different compilation according to an exemplary embodiment of the present invention. According to an embodiment of the present invention, a first netlist compared may correspond to a first compilation of a design for a system and a second netlist compared may correspond to a second compilation of the design for the system where modifications are made to the first design of the system. The method described with reference to FIG. 3 may be implemented at 112 in FIG. 1. At 301, hash values are computed for every node in the netlists. According to an embodiment of the present invention, the hash values are computed based on their name, type, and connectivity. It should be appreciated that other parameters may also be used.

At 302, hash values of nodes from a first netlist are compared with hash values of nodes from a second netlist. Nodes having the same hash values are identified as being candidates.

At 303, inputs of pairs of candidates are traversed to identify equivalent nodes. According to an embodiment of the present invention, the inputs are traversed to a point reaching a FIB. If the inputs to the pair of candidates also match as determined by the traversal, the pair of candidates are designated as equivalent nodes.

At 304, modified nodes are marked. According to an embodiment of the present invention, if candidate nodes are determined to be different, then all nodes of that the candidate nodes feed transitively on the extraction netlist from the second compilation will be marked as being modified up to and including the point reaching a FIB.

According to an embodiment of the present invention, a mapping from the extraction netlist from the first compilation and the synthesis optimizations netlist from the second compilation is generated. It should be appreciated that the mapping may also be performed after synthesis optimizations during the first compilation.

Figure 4:
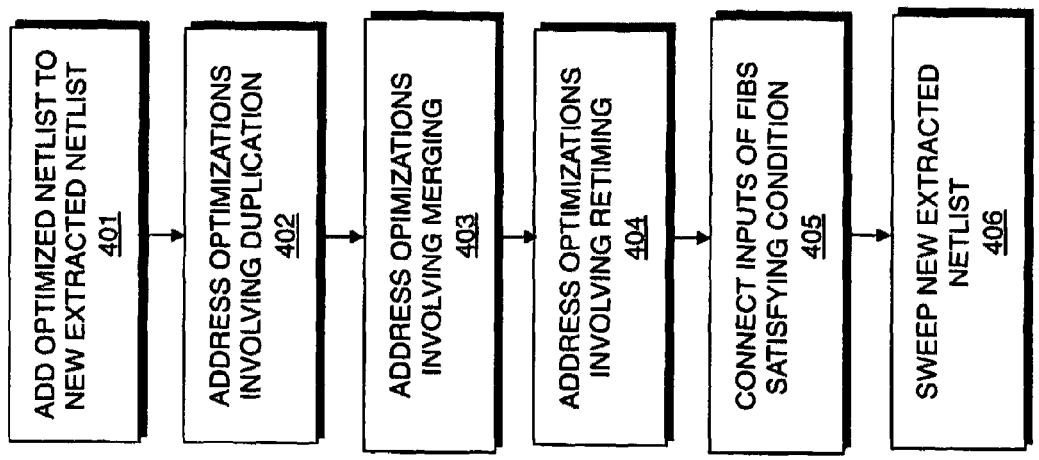
FIG. 4 illustrates a method for replacing identical regions according to an exemplary embodiment of the present invention.

FIG. 4 illustrates a method for replacing identical regions according to an exemplary embodiment of the present invention. The method described with reference to FIG. 4 may be implemented at 113 at FIG. 1. At 401, a synthesized optimizations netlist for a first design of a system previously generated during a first compilation is added into an extraction netlist for a second design of the system generated during a second compilation. According to an embodiment of the present invention, input and output pins are renamed so that they do not conflict.

At 402, synthesis optimizations involving duplication are addressed. According to an embodiment of the present invention, FIBs in the extraction netlist for the second design having an equivalent node are identified and traversed in topological order from inputs to outputs. If the FIB in the extraction netlist for the first design is also a FIB in the synthesis extraction netlist (has not been invalidated) and has been duplicated during synthesis optimizations, then duplicate the FIB in the extraction netlist for the second design and connect the duplicated FIB to the logic the duplicated FIB is driving in the synthesis optimization netlist from the first compilation.

Figure 5A:
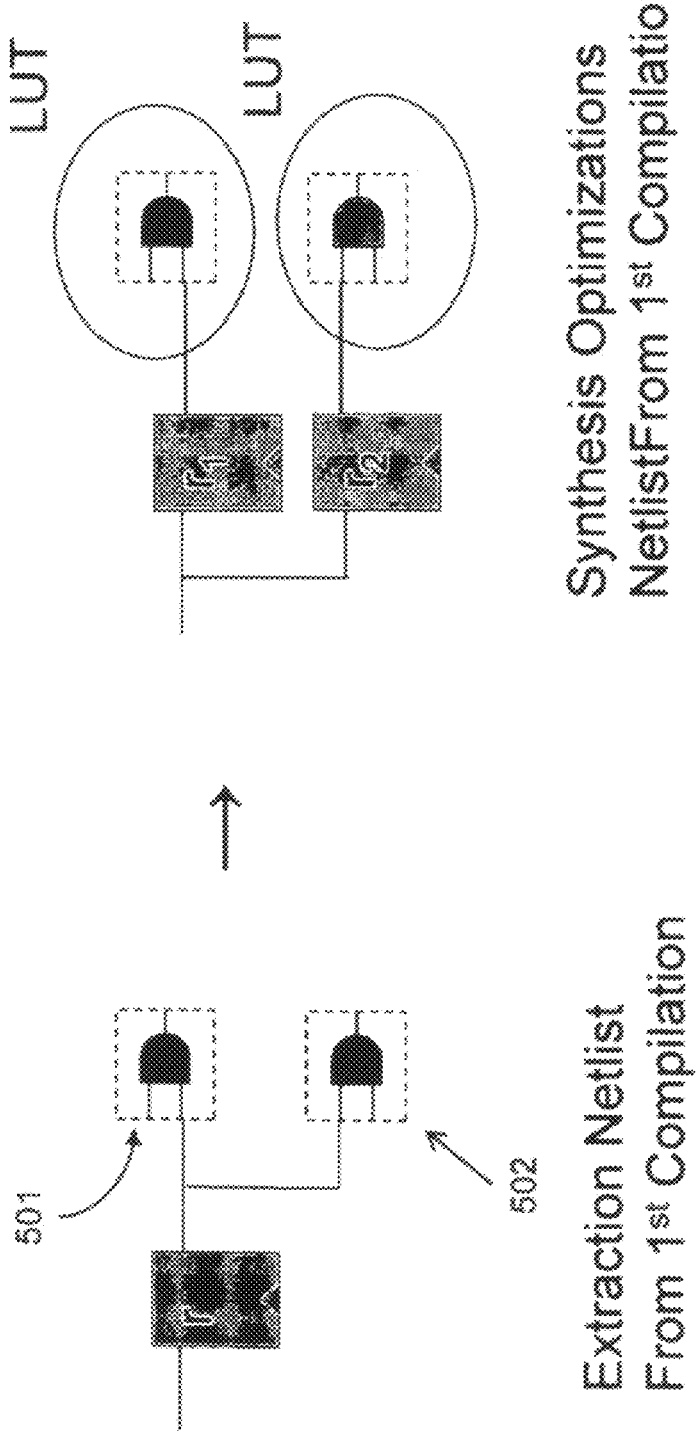

FIGS. 5A and 5B illustrate an example of how register duplication is addressed during resynthesis according to an embodiment of the present invention. FIG. 5A illustrates a portion of a system 510 shown in an extraction netlist of a first design of a system during a first compilation. The portion of the system 510 includes a register r as a FIB which gets duplicated. As shown in a synthesis optimization netlist of the first design, register r is duplicated and becomes $r_1$ and $r_2$ during synthesis optimizations. Logic gates 501 and 502 are also mapped to LUTs during synthesis optimizations. The duplication of register r is recorded. In order to reuse the synthesis optimizations of the first design of the system generated during the first compilation, an equivalent register r in an extraction netlist of a second design for a system in a second compilation must be duplicated prior to connecting optimized synthesized region from the first compilation. FIG. 5B illustrates that even if logic changes in a second design for the system, register r may still be duplicated and some synthesized optimizations may be utilized from the first compilation.

Referring back to FIG. 4, at 403, synthesis optimizations involving merging are addressed. According to an embodiment of the present invention, FIBs in the extraction netlist for the second design having an equivalent node are identified and traversed in topological order from inputs to outputs. If the FIB in the extraction netlist for the first design is also a FIB in the synthesis extraction netlist (has not been invalidated) and has been merged during synthesis optimizations, then determine whether the FIB it was merged with has not been modified in the second design of the system. If the FIB has been modified in the second design in the system, do not utilize the synthesized optimizations associated with the FIB from the first compilation in the second compilation.

Figure 6A:
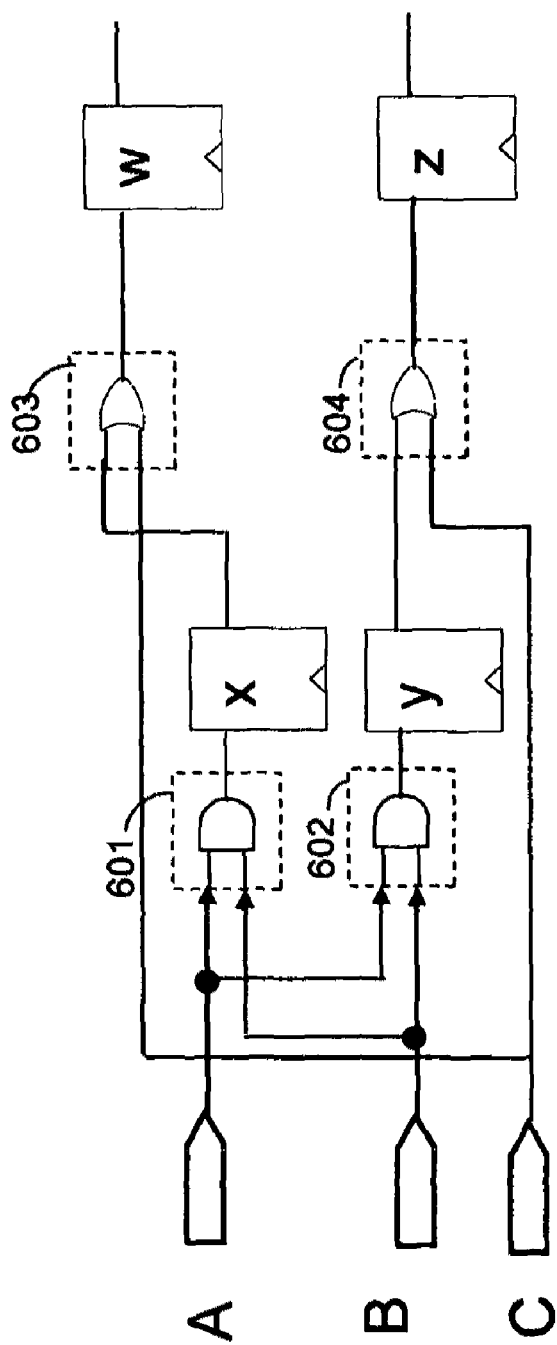
FIGS. 6A-6D illustrate an example of how register merging is addressed according to an embodiment of the present invention.
Figure 6B:
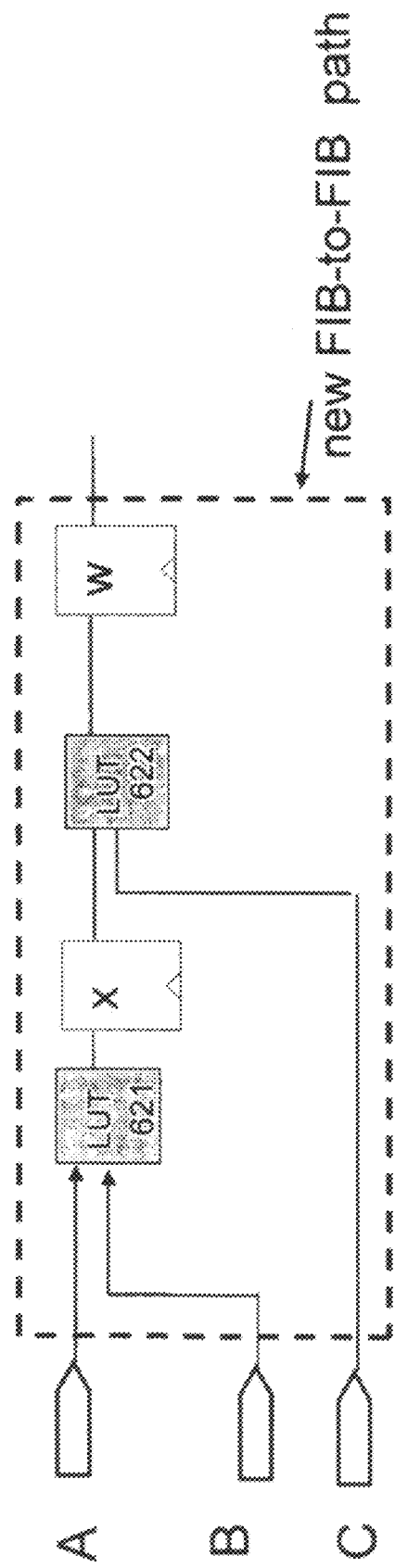

FIGS. 6A-6D illustrate an example of how register merging is addressed according to an embodiment of the present invention. FIG. 6A illustrates a portion of a first design for a system after extraction during a first compilation. The portion includes inputs A, B, and C, logic gates 601-604, and registers w, x, y, and z. FIG. 6B illustrates the portion of the design for the system after synthesis optimizations are performed during the first compilation. As shown, registers x and y are merged into register x and registers w and z are merged into register w. When registers x and y are merged, they are invalidated as FIBS. When registers w and z are merged, they are invalidated as FIBs. Logic gates 601 and 602 are technology mapped to LUT 621. Logic gates 603 and 604 are technology mapped to LUT 622. As shown in FIG. 6*b*, the FIB-to-FIB cone of logic is expanded.

Figure 6C:
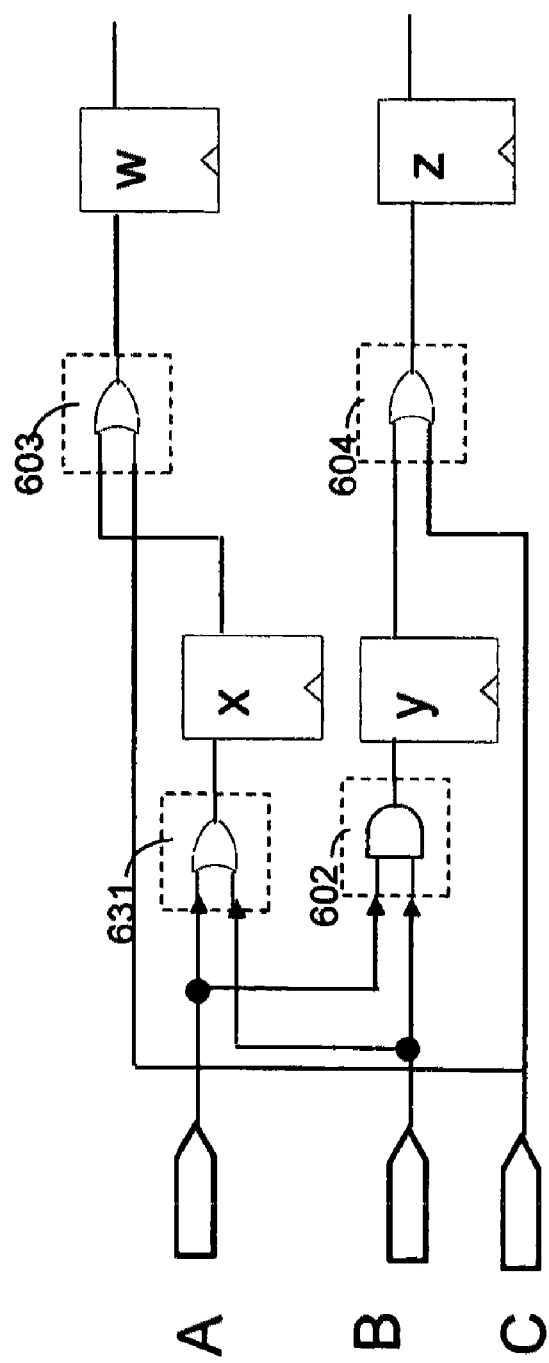

FIG. 6C illustrates a portion of a second design for the system after extraction during a second compilation. FIG. 6*c* illustrates that logic gate 601 from the first design of the system has been changed to logic gate 631. With the change to logic gate 601 to logic gate 631, registers x and y can no longer be merged. Registers w and z can also no longer be merged. Thus, as shown, the synthesized optimizations from the first compilation illustrated in FIG. 6b can only be reused in the second compilation if all the logic gates 601-604 and all registers, w, x, y, and z remain unchanged in the second compilation.

Figure 6D:
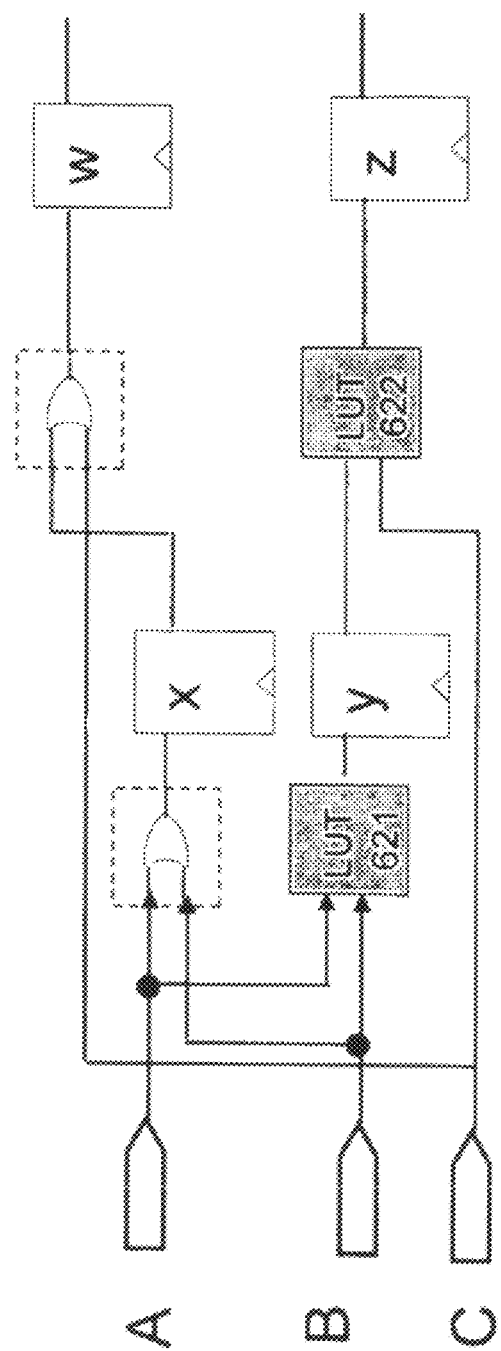

FIG. 6D illustrates that the synthesis optimizations for logic y and z can be reused provided that they did not change.

Figure 7A:
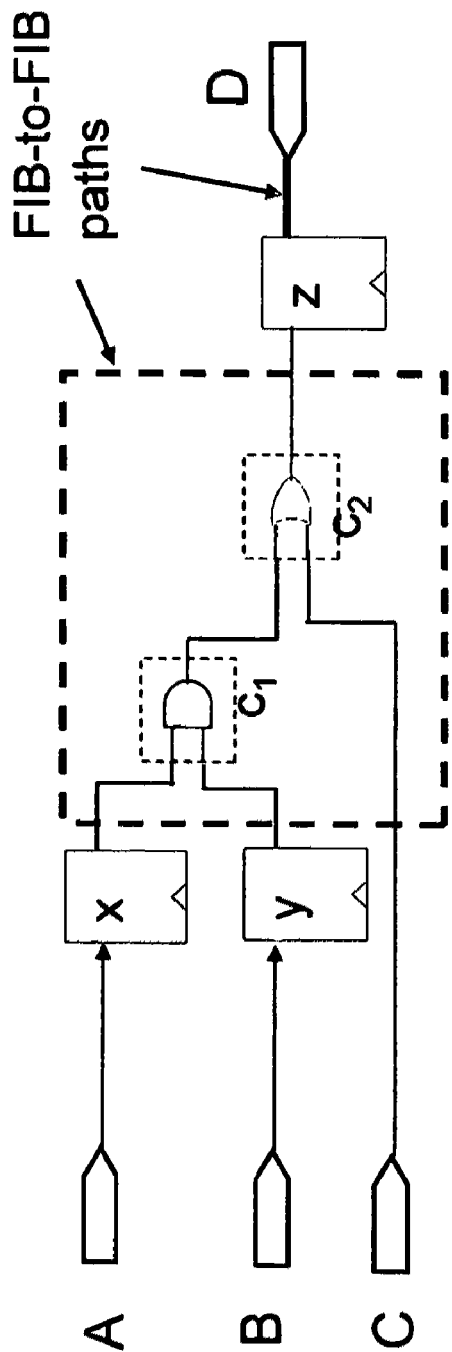
FIGS. 7A-7C illustrate an example of how register retiming is addressed according to an exemplary embodiment of the present invention.
Figure 7B:
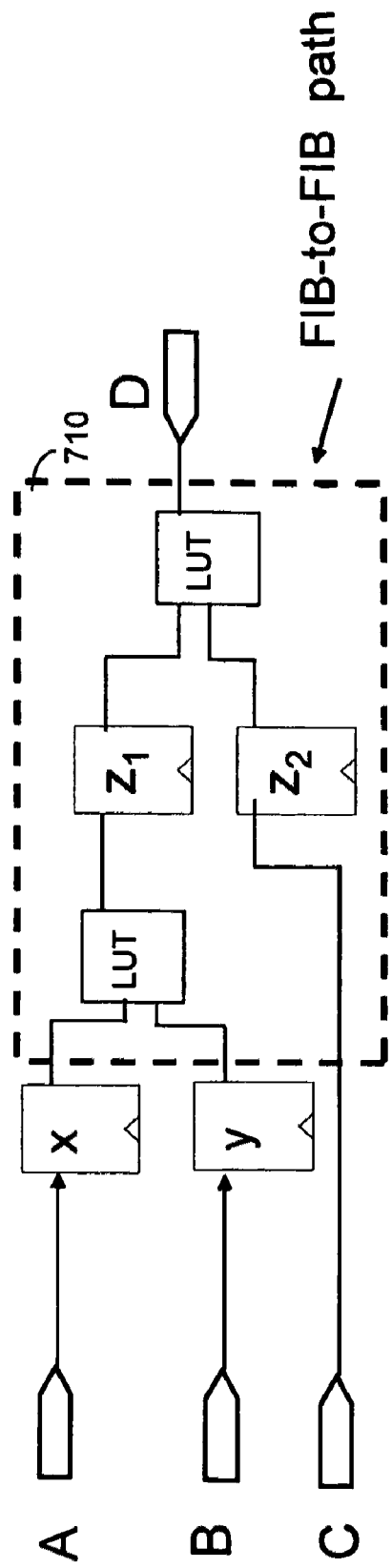
Figure 7C:
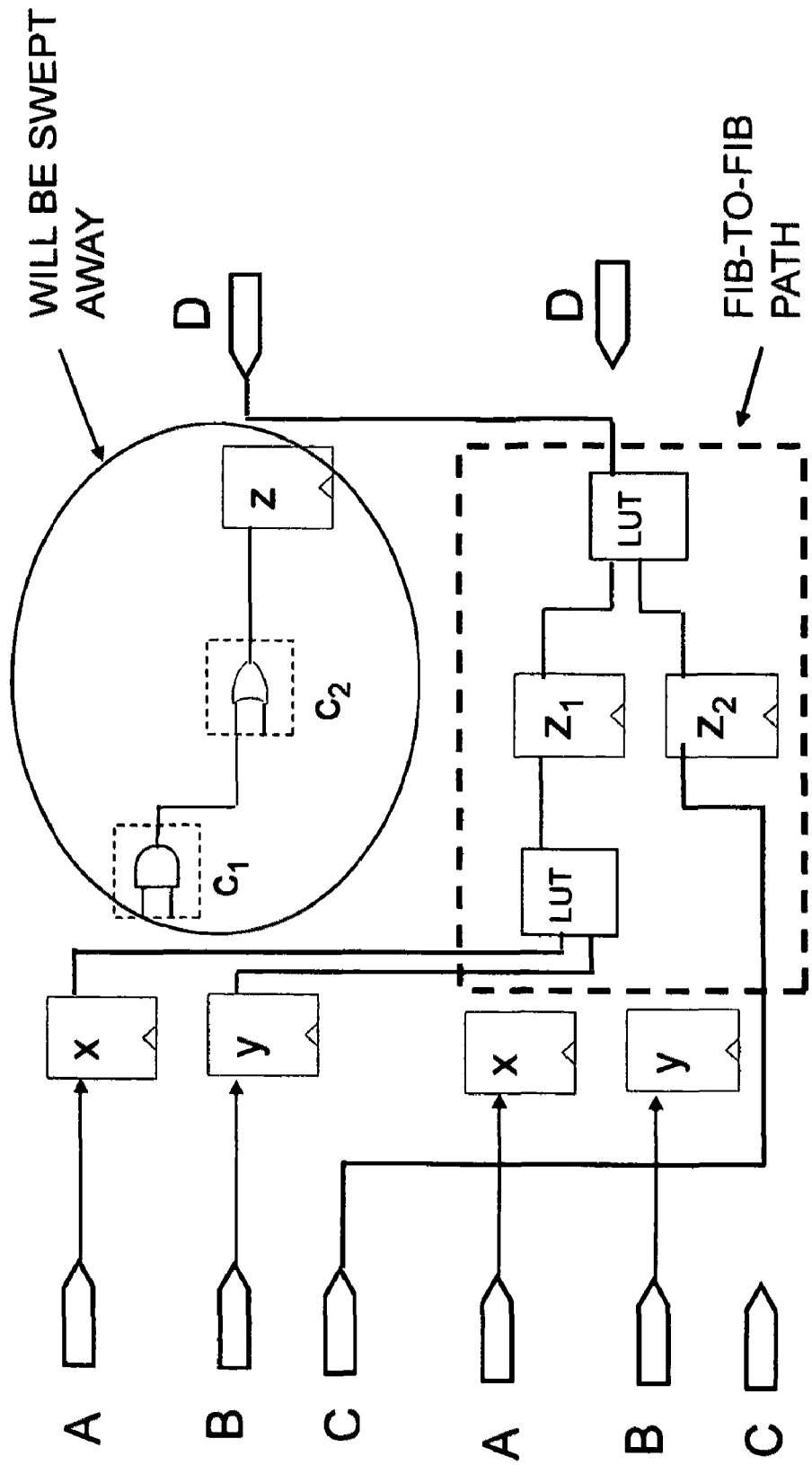

Referring back to FIG. 4, at 404, synthesis optimizations involving retiming are addressed. FIGS. 7A-7C illustrate an example of how register retiming is addressed according to an embodiment of the present invention. FIG. 7A illustrates an extraction netlist of a system design during a first compilation. All of the nodes in the netlist are designated as FIBs. FIG. 7B illustrates a synthesis optimization netlist of the system design during the first compilation where register z is backward retimed into $\{z_1, z_2\}$ and synthesized logic 710 is generated. Whenever optimizations are performed across a FIB, the FIB is invalidated. Therefore, register z is invalidated s a FIB and the FIB-to-FIB path is expanded. If the system design were to be modified such that any of $\{c_1, c_2, z\}$ changes, the synthesized logic 710 would not be reusable. However, if $\{c_1, c_2, z\}$ were to remain the same, then synthesized logic 710 may be reused as illustrated in FIG. 7C Referring back to FIG. 4, at 405, FIBs satisfying conditions are connected. According to an embodiment of the present invention, all FIBs in the extraction netlist for the second design of the system generated during the second compilation are checked to determine whether they have an equivalent node from the extraction netlist for the first design of the system generated during the first compilation. If a FIB from the extraction netlist for the second design has an equivalent node and the FIB is also in the synthesis extraction netlist (has not been invalidated), then the input to the FIB is connected to the output of the synthesized logic from the synthesis optimized netlist from the first compilation. According to an embodiment of the present invention, satisfying the conditions described identifies identical regions associated with the equivalent nodes. FIBs from the extraction netlist that are new to the design of the system because they represent a modification from the first design of the system are not replaced with synthesized logic. If it has been determined that the synthesized logic involves a merge with a FIB that is later changed in the second compilation, the synthesized logic is not connected to the input to the FIB in the extraction netlist.

At 406, the new extraction netlist is swept. According to an embodiment of the present invention, sweeping the extraction netlist may include removing dangling input and output pins, removing unconnected logic, removing unconnected FIBS from the previous synthesis optimized netlist, and connecting unchanged outputs of the extraction netlist from the second compilation to logic elements from the synthesis optimized netlist from the first compilation.

According to an embodiment of the present invention, by connecting the input of the FIB to an output of the synthesized logic from the synthesized optimized netlist at 405 and sweeping away unconnected logic, identical regions in the extracted netlist in the second compilation are replaced with optimized synthesized regions from the synthesis optimized netlist.

FIGS. 1, 3, and 4 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 8A:
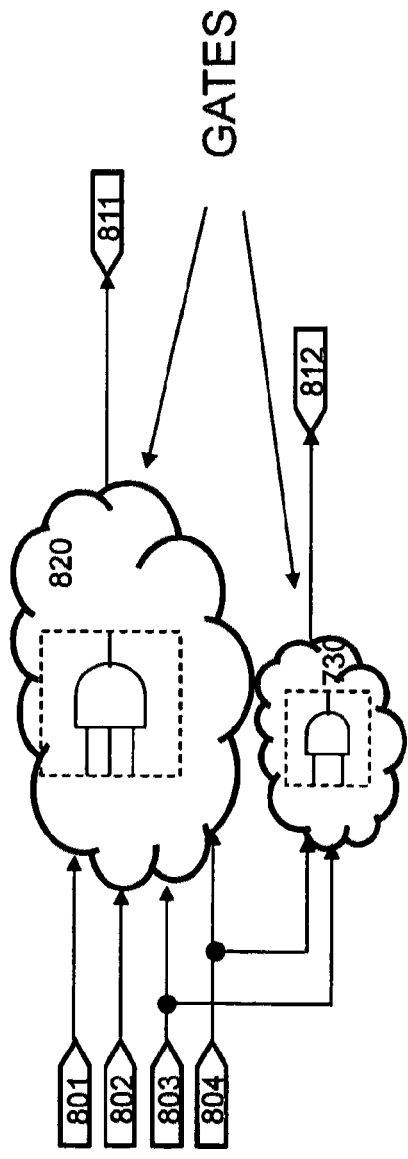

FIGS. 8A-8H illustrate an example of performing fast incremental resynthesis according to an exemplary embodiment of the present invention. FIG. 8A illustrates an extraction netlist of a first design of a system during a first compilation according to an embodiment of the present invention. The extraction netlist includes a plurality of inputs 801-804, a plurality of outputs 811-812, a first plurality of logic 820, and a second plurality of logic 830.

Figure 8B:
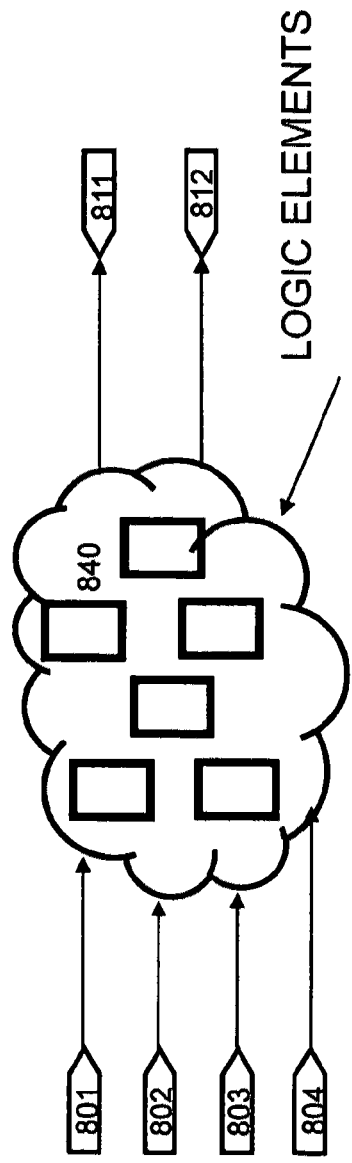

FIG. 8B illustrates a synthesis optimization netlist of the first design of the system during the first compilation according to an embodiment of the present invention. As illustrated the first plurality of logic 820 and second plurality of logic 830 have been optimized and technology mapped into a synthesized region that may include a plurality of logic elements 840.

FIG. 8C illustrates an extraction netlist of a second design of a system during a second compilation according to an embodiment of the present invention. The extraction netlist includes a plurality of inputs 851-854, a plurality of outputs 861-862, a first plurality of logic 870, and a second plurality of logic 880. From performing a differentiation procedure on the extraction netlists from the first and second compilation, the first design of the system and the second design of the system are determined to be identical with the exception of the second plurality of logic 830 from the first design and the second plurality of logic 880 from the second design.

Figure 8D:
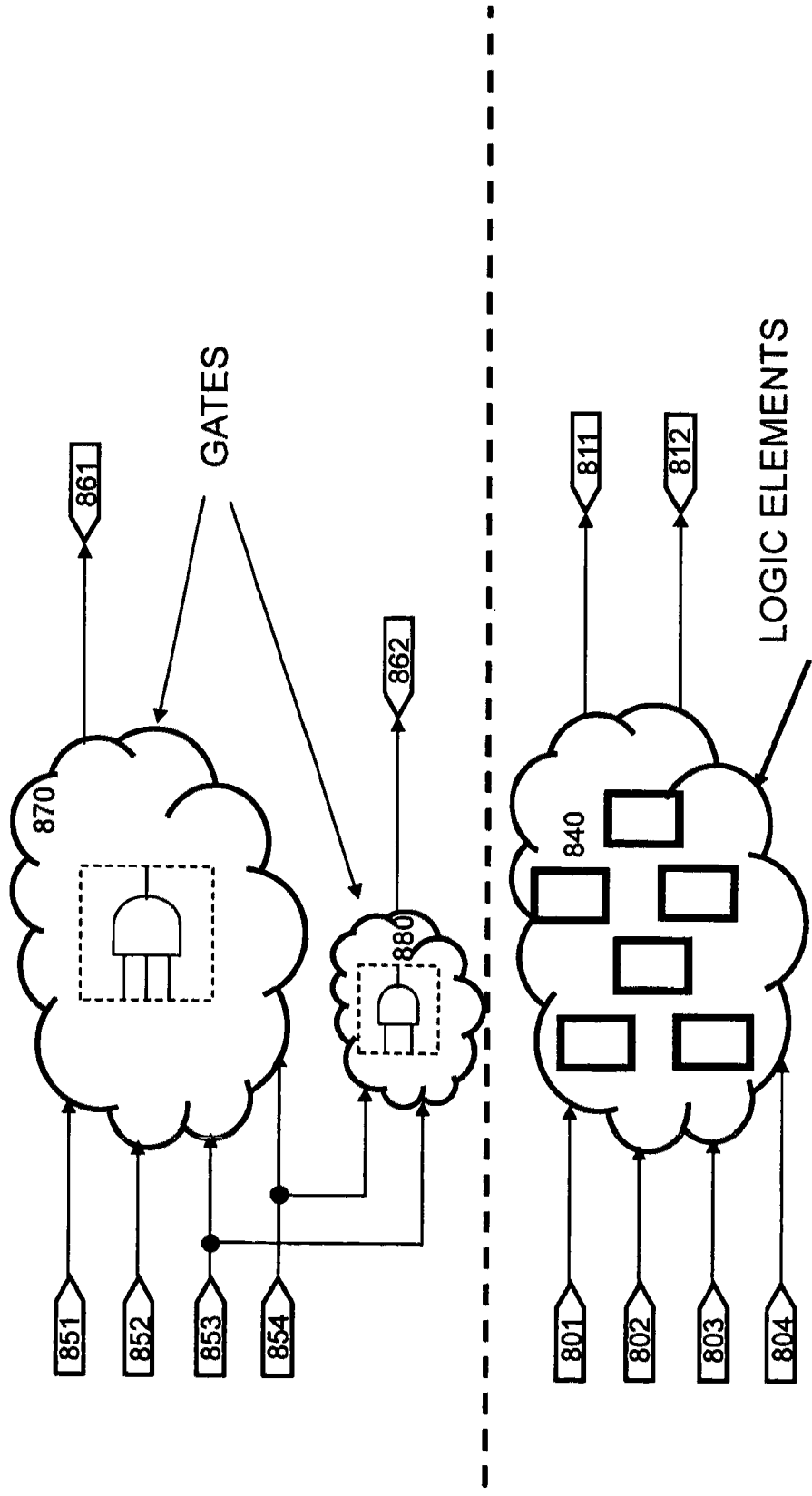

FIG. 8D illustrates a first procedure for replacing an identical region with synthesis optimizations from a previous compilation according to an embodiment of the present invention. As shown, the synthesis optimization netlist from the first compilation is added to the extraction netlist from the second compilation.

Figure 8E:
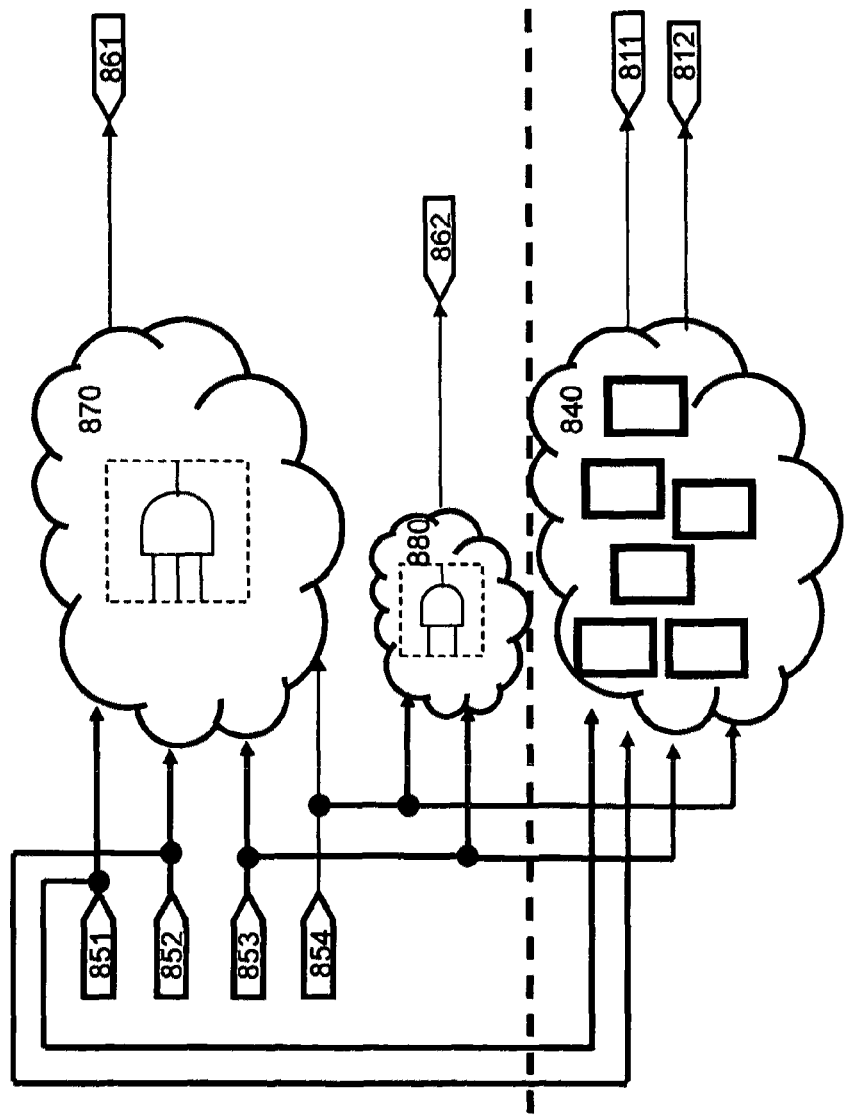

FIG. 8E illustrates a second procedure for replacing an identical region with synthesis optimizations from a previous compilation according o an embodiment of the present invention. As shown, inputs 851-854 of the extraction netlist from the second compilation are connected to logic elements 840 of the synthesis optimization netlist. Input pins 801-804 of the synthesis optimization netlist from the first compilation are disconnected from the logic elements 840.

Figure 8F:
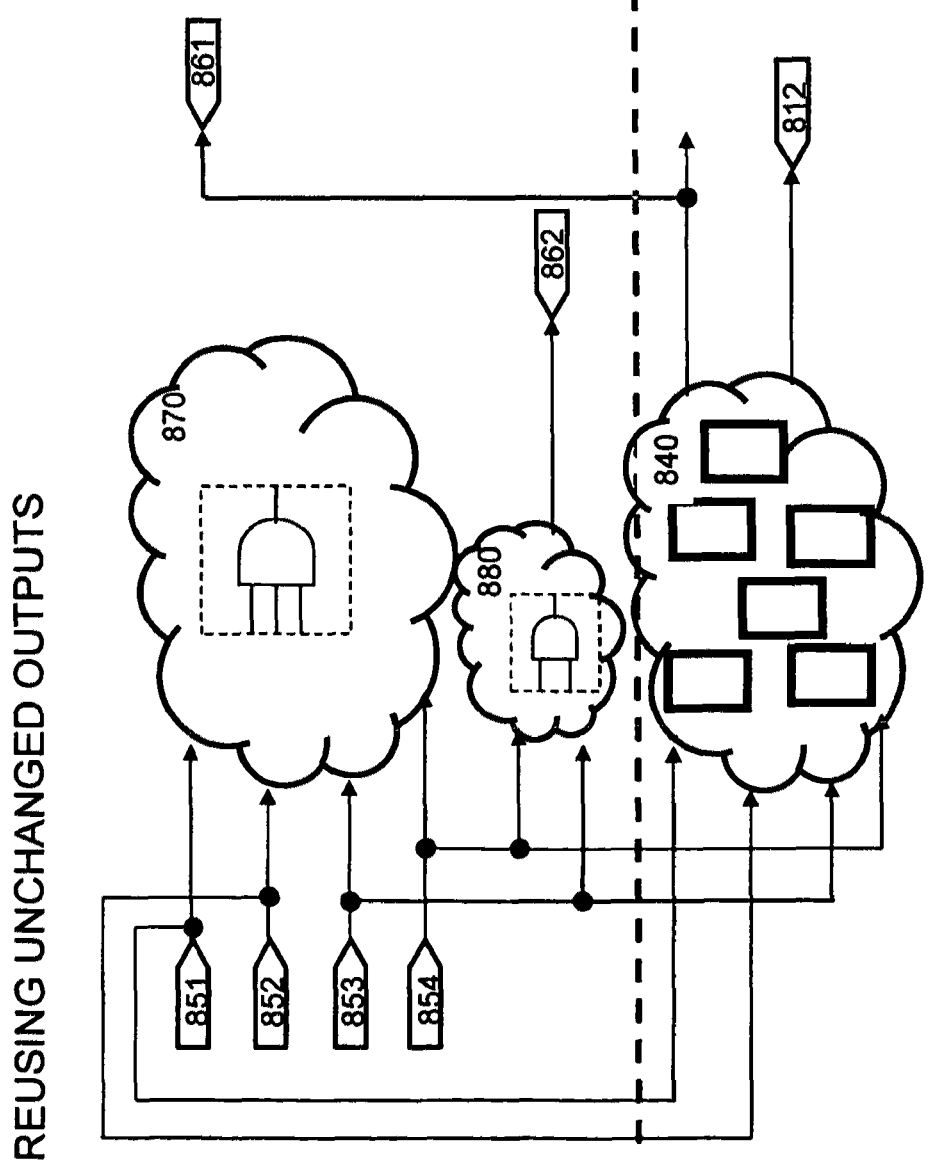

FIG. 8F illustrates a third procedure for replacing identical regions with synthesis optimizations from a previous compilation according to an embodiment of the present invention. As shown, unchanged outputs are reused. Unchanged outputs of the extraction netlist from the second compilation are connected to logic elements 840 from the synthesis optimizations netlist from the first compilation. Output pins from the synthesis optimizations netlist from the first compilation are disconnected.

Figure 8G:
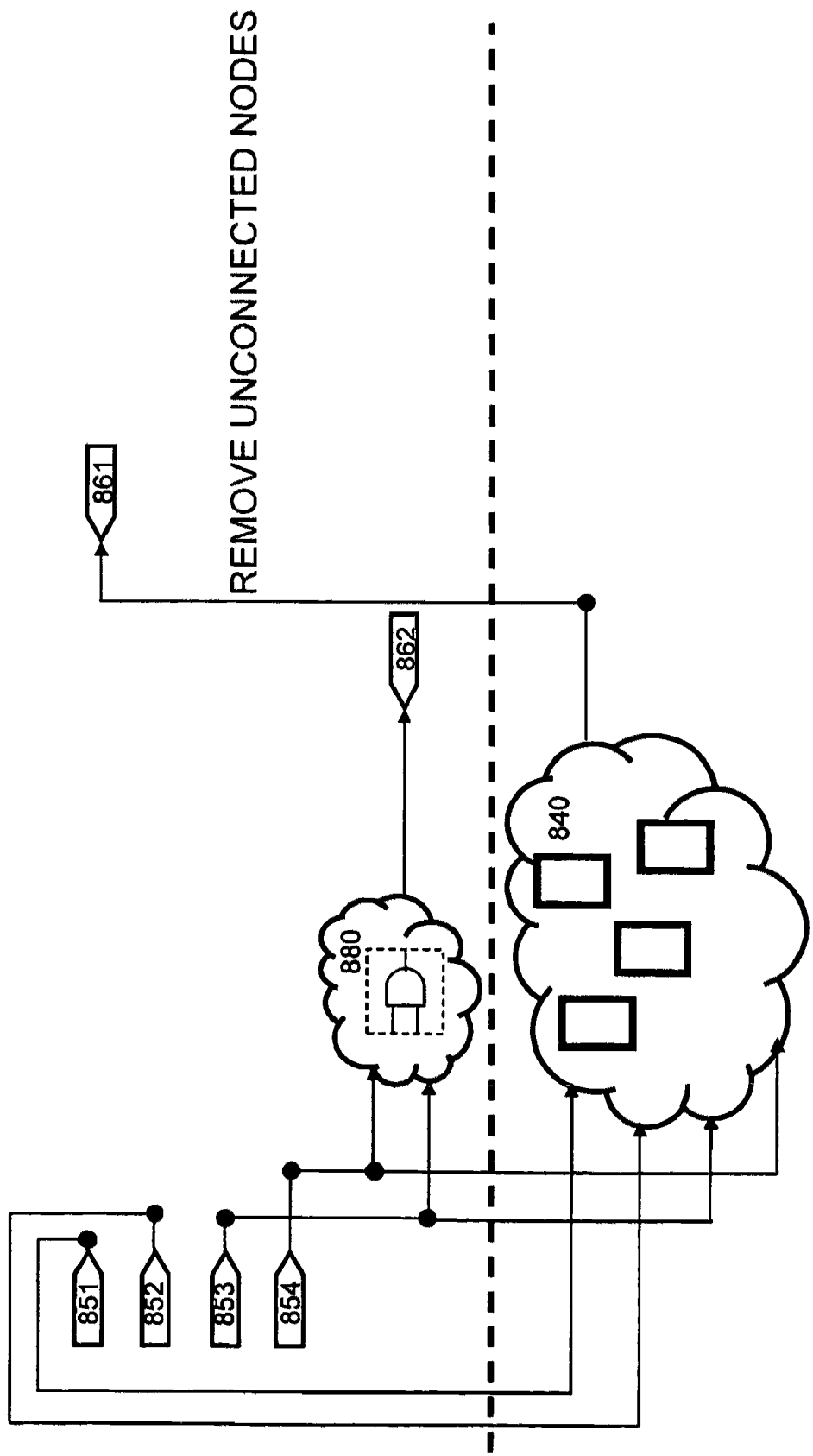

FIG. 8G illustrates a fourth procedure for replacing identical regions with synthesis optimizations from a previous compilation according to an embodiment of the present invention. As shown, unconnected logic and old FIBs are removed. Sweeping of logic in logic elements 840 results in a new set of logic elements 890.

Figure 8H:
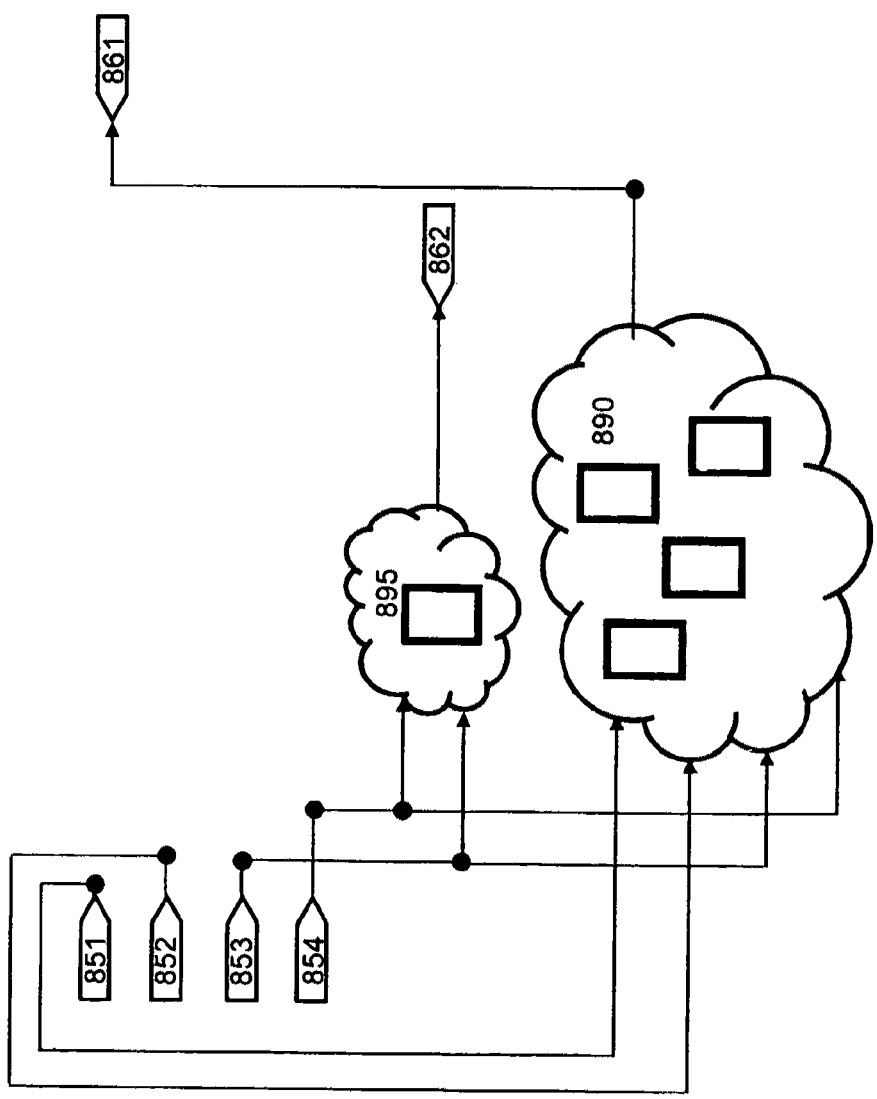

FIG. 8H illustrates a synthesis optimizations netlist of the portion of the second design of the system during the second compilation according to an embodiment of the present invention. Synthesis optimizations need only be performed on the portion of the second design of the system that has been modified, which is the second plurality of logic 880. As shown, the second plurality of logic 880 has been optimized and technology mapped into logic element 895. According to an embodiment of the present invention, timing information from the placement and routing performed during the first compilation may be used to set logic delay constraints when performing synthesis optimizations on the second plurality of logic 880. The logic delay constraint may be a function of the timing constraint minus the routing delay from the first compilation.

Figure 9:
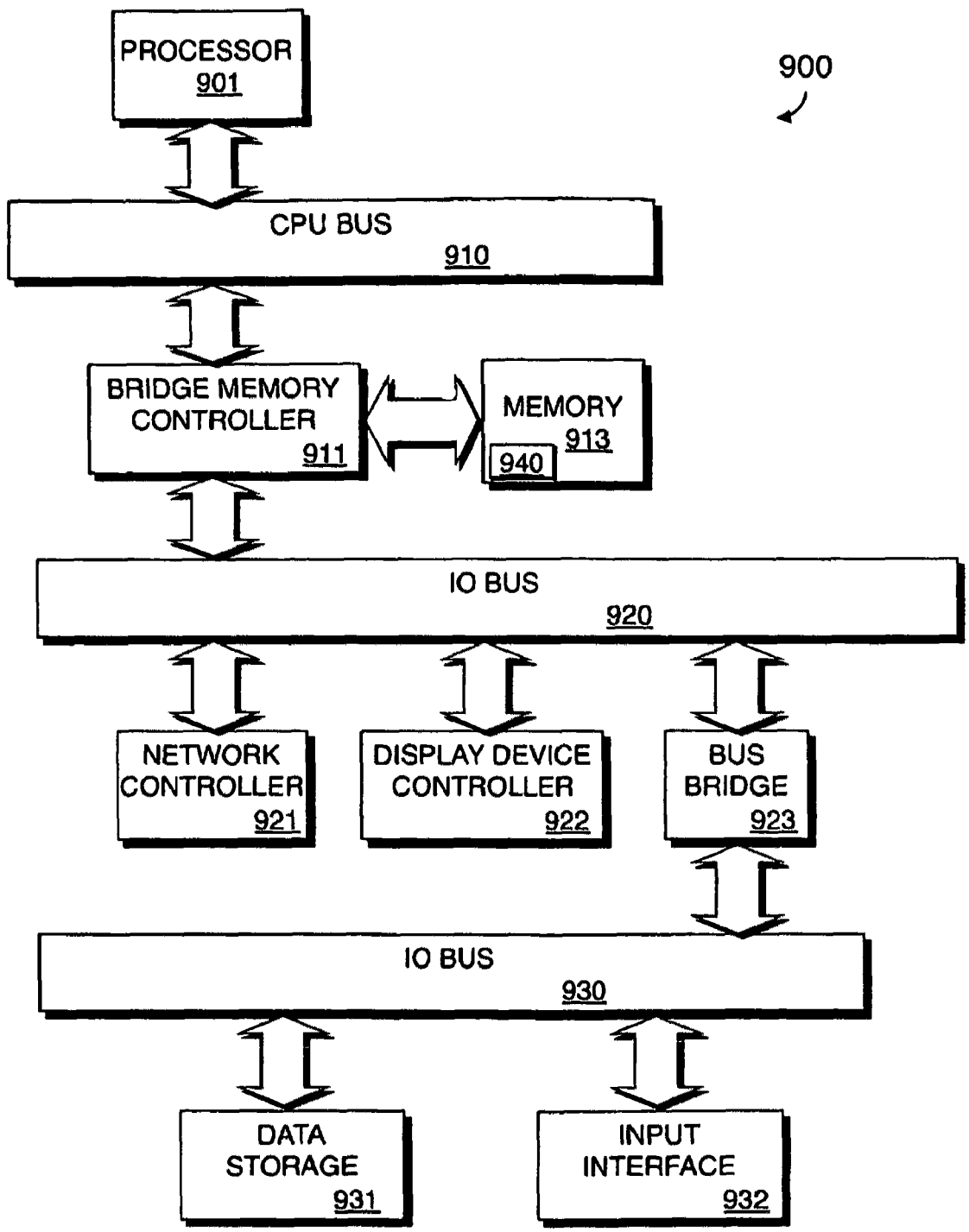
FIG. 9 illustrates a block diagram of a computer system implementing a system designer according to an embodiment of the present invention.

FIG. 9 illustrates a block diagram of a computer system implementing a system designer according to an embodiment of the present invention. As shown, the computer system 900 includes a processor 901. The processor 901 is coupled to a CPU bus 910 that transmits data signals between the processor 901 and other components in the computer system 900.

The computer system 900 includes a memory 913. The memory 913 may be a dynamic random access memory device, a static random access memory device, and/or other memory device. The memory 913 may store instructions and code represented by data signals that may be executed by the processor 901. A bridge memory controller 911 is coupled to the CPU bus 910 and the memory 913. The bridge memory controller 911 directs data signals between the processor 901, the memory 913, and other components in the computer system 900 and bridges the data signals between the CPU bus 910, the memory 913, and a first IO bus 920.

The first IO bus 920 may be a single bus or a combination of multiple buses. The first IO bus 920 provides communication links between components in the computer system 900. A network controller 921 is coupled to the first IO bus 920. The network controller 921 may link the computer system 900 to a network of computers (not shown) and supports communication among the machines. A display device controller 922 is coupled to the first IO bus 920. The display device controller 922 allows coupling of a display device (not shown) to the computer system 900 and acts as an interface between the display device and the computer system 900.

A second IO bus 930 may be a single bus or a combination of multiple buses. The second IO bus 930 provides communication links between components in the computer system 900. A data storage device 931 is coupled to the second IO bus 930. The data storage device 931 may be a hard disk drive, a floppy disk drive, a CD-ROM device, a flash memory device or other mass storage device. An input interface 932 is coupled to the second IO bus 930. The input interface 932 allows coupling of an input device to the computer system 900 and transmits data signals from an input device to the computer system 100. A bus bridge 923 couples the first IO bus 920 to the second IO bus 930. The bus bridge 923 operates to buffer and bridge data signals between the first IO bus 920 and the second IO bus 930. It should be appreciated that computer systems having a different architecture may also be used to implement the computer system 900.

A system designer 940 may reside in memory 913 and be executed by the processor 901. The system designer 940 may operate to synthesize the system, place the system on a target device, route the system, assemble the system, and program a target device to implement the system. The system designer 940 may perform fast incremental resynthesis that reuses synthesis results from a previous compilation to minimize the amount of logic that needs to be synthesized to reduce runtime. The structure of unchanged logic is preserved by the system designer 940 to provide timing closure. The system designer 940 may use place and route timing information from the previous compilation to guide the synthesis of changed regions of logic during a subsequent compilation to improve timing closure.

Figure 10:
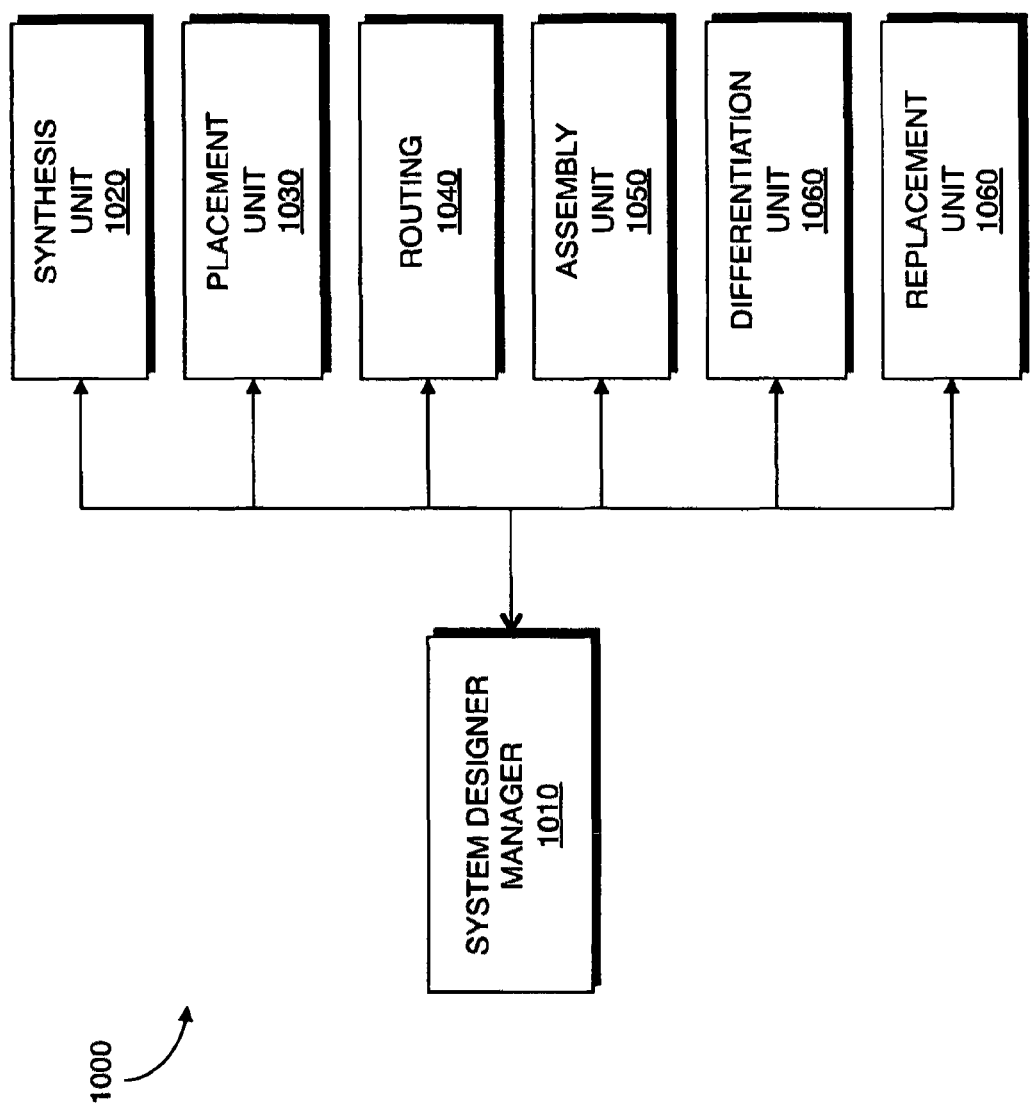
FIG. 10 is a block diagram of a system designer according to an exemplary embodiment of the present invention.

FIG. 10 illustrates a system designer 100 according to an exemplary embodiment of the present invention. The system designer 100 may be used to implement the system designer 940 shown in FIG. 9 and may perform procedures described in FIGS. 1, 3, and 4. The system designer 900 may be a CAD tool for designing a system on a target device. The target device may be, for example, an ASIC, a structured ASIC, an FPGA, a programmable logic device (PLD), a printed circuit board (PCB), or other circuitry. FIG. 10 illustrates modules implementing an embodiment of the system designer 1000. According to one embodiment, system design may be performed by a computer system, such as for example the computer system illustrated in FIG. 9, executing sequences of instructions represented by the modules shown in FIG. 10. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 1000 includes a system designer manager 1010. The system designer manager 1010 is connected to and transmits data between the components of the system designer 1000.

Block 1020 represents a synthesis unit. According to an embodiment of the present invention, the synthesis unit 1020 performs extraction on a design of the system to create an initial structural representation of the system. Extraction includes generating a logical representation of the system from a high level description (HDL) of the system. The high level description of the system may be in the form of schematics, VHDL, Verilog or other design definition. The logical representation may include a representation that includes structural components such as functional blocks and registers ("components"), such as logic gates and logic elements, required for the system. According to an embodiment of the present invention, initial optimizations may also be performed during extraction. These initial optimizations may include the cleanout of netlists and constant propagation. An extraction netlist is created during extraction and is written into storage.

The synthesis unit 1020 also performs synthesis optimizations on the extraction netlist to reduce area and to improve speed of the system. The optimizations may include performing procedures such as high level logic synthesis of adders, multiplexers and state machines, lower level multi level synthesis optimizations that operate on combinational gates and registers, and technology mapping to create a netlist of blocks that are supported by the resources available on the target device. It should be appreciated that the lower level multi level synthesis optimizations may include sequential synthesis transformations such as register retiming, duplication, and merging. A synthesis optimizations netlist is created during synthesis optimizations and written to storage.

Block 1030 represents a placement unit. The placement unit 1030 places the system on to the target device by determining which components or areas on the target device are to be used for specific functional blocks and registers. According to an embodiment of the system designer 1000, the placement unit 1030 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1030 may utilize a cost function in order to determine a good assignment of resources on the target device.

Block 1040 represents a routing unit. The routing unit 1040 determines the routing resources on the target device to use to provide interconnection between the components implementing functional blocks and registers of the logic design.

Timing data derived from the placement and routing of the first design of the system is written to storage.

Block 1050 represents an assembly unit. The assembly unit 1050 creates a data file that includes information determined by the compilation procedure performed by the system designer 1000. The data file may be a bit stream that may be used to program a target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

According to an embodiment of the present invention, modifications can be made to a first design of a system and a second compilation is run on the second design created where the synthesis unit 1020 first performs extraction on the second design and creates a second extraction netlist. Block 1060 represents a differentiation unit. The differentiation unit 1060 performs a differentiation procedure on the extraction netlist for the first design created from the first compilation and the extraction netlist for the second design created from the second compilation. The differentiation procedure identifies equivalent nodes in the subsequent compilation. According to an embodiment of the present invention, the differentiation procedure examines the structural qualities of the nodes in the netlists. The differentiation procedure may be performed in accordance to the procedures described with reference to FIG. 3. A mapping may also be generated between extraction netlist and the synthesis optimization netlist from the first compilation.

Block 1070 represents a replacement unit. The replacement unit replaces identical regions in the extraction netlist from the second compilation with synthesis optimization implementations from the first compilation. The replacement procedure may be performed in accordance to the procedure described with reference to FIG. 4. Optimizations may then be performed on regions in the extraction netlist that have changed. According to an embodiment of the present invention, timing information from the placement and routing of the first design of the system from the first compile is used to compute an approximation of the amount of routing delay that will be required for changed logic in the second design of the system. For example, the routing delay necessary to traverse between FIB boundaries may be used to generate an estimate. Given the timing constraint for the design/clock domain and the routing delay of the path, an upper bound on the amount of logic delay that can be added to paths in the second design of the system may be derived. A synthesis optimizations netlist is created for the second design of the system during synthesis optimizations.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 11:
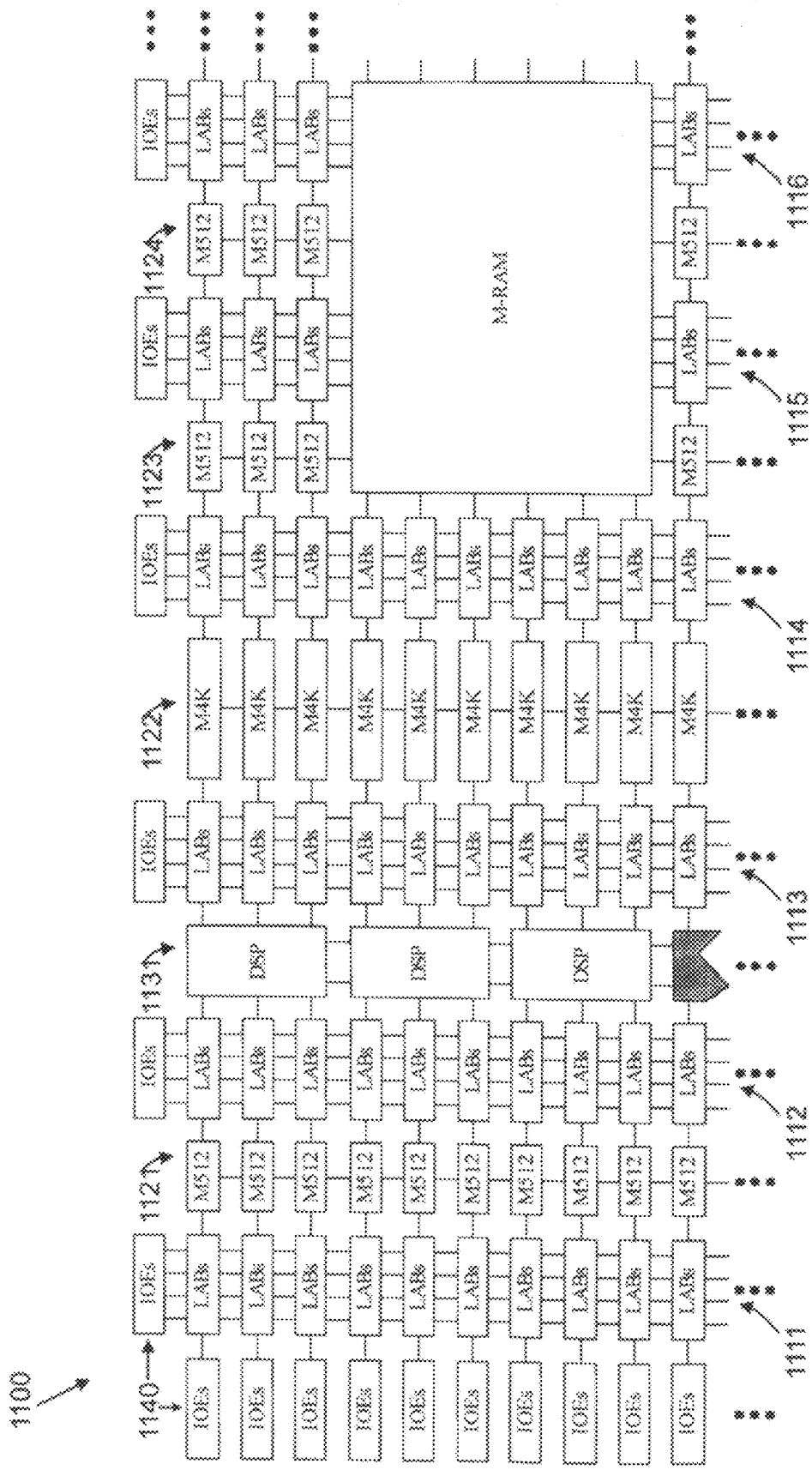
FIG. 11 illustrates an exemplary target device according to an embodiment of the present invention.

FIG. 11 illustrates a device 1100 that may be used to implement a target device according to an embodiment of the present invention. The device 1100 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1100. Columns of LABs are shown as 1111-1116. It should be appreciated that the logic block may include additional or alternate components.

The device 1100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1100. Columns of memory blocks are shown as 1121-1124.

The device 1100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1100 and are shown as 1131.

The device 1100 includes a plurality of input/output elements (IOEs) 1140. Each IOE feeds an IO pin (not shown) on the device 1100. The IOEs 1140 are located at the end of LAB rows and columns around the periphery of the device 1100. Each IOE may include a bidirectional IO buffer and a plurality of registers for registering input, output, and output-enable signals.

The device 1100 may include routing resources such as LAB local interconnect lines, row interconnect lines ("H-type wires"), and column interconnect lines ("V-type wires") (not shown) to route signals between components on the target device.

According to an embodiment of the present invention, the procedures described discloses a method for a system on a target device where a first netlist is generated with a first set of FIBs after performing extraction during synthesis of a first version of the system in a first compilation. One or more of the FIBs from the first set are invalidated after performing optimizations during synthesis in the first compilation resulting in a second netlist with a second set of FIBs. A third netlist with a third set of FIBS is generated after performing extraction during synthesis of a second version of the system having a changed portion in a second compilation. The connectivity of matching nodes reaching FIBs are traversed from the first netlist and the third netlist to identify equivalent nodes associated with identical regions. The identical region in the third netlist is replaced with an optimized synthesized region from the second netlist.

According to an embodiment of the present invention, the procedures described also discloses a method for designing a system on a target device where extraction is performed on a first version of the system during synthesis in a first compilation resulting in a first netlist. Optimizations are performed on the first version of the system during synthesis in the first compilation resulting in a second netlist. Placement and routing are performed on the first version of the system in the first compilation. Extraction is performed on a second version of the system having a changed portion during synthesis in a second compilation resulting in a third netlist. The first version of the system is differentiated from the second version of the system in the third netlist to identify identical regions. An identical region on the third netlist is replaced with an optimized version of the identical region from the second netlist.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, the method comprising:
    generating a first netlist with a first set of functionally invariant boundaries (FIBs) after performing extraction during synthesis of a first version of the system in a first compilation;
    invalidating one or more of the FIBs from the first set after performing optimizations during synthesis in the first compilation resulting in a second netlist with a second set of FIBs;
    generating a third netlist with a third set of FIBs after performing extraction during synthesis of a second version of the system having a changed portion in a second compilation;
    traversing connectivity of matching nodes from the first netlist and the third netlist reaching FIBs to identify equivalent nodes associated with identical regions; and
    replacing the identical region in the third netlist with an optimized synthesized region from the second netlist, wherein at least one of the invalidating, generating, traversing, and replacing is performed by a processor.

2. The method of claim 1, wherein all nodes in the first netlist are FIBs.

3. The method of claim 1, wherein a FIB is invalidated after performing optimizations when an optimization is performed on the FIB or across the FIB.

4. The method of claim 1, further comprising:
    computing hash values of nodes in the first netlist and the second netlist based on the nodes name, type, and connectivity; and
    using the hash values to identify the matching nodes.

5. The method of claim 1, wherein traversing connectivity of matching nodes from the first netlist and the third netlist comprises comparing inputs of the matching nodes reaching a FIB to identifying the identical region.

6. The method of claim 1, further comprising generating a mapping between the first set of FIBs and the second set of FIBs.

7. The method of claim 1, wherein replacing the identical region comprises:
    adding the second netlist to the third netlist; and
    connecting an input of a FIB in the third netlist to an output of synthesized logic in the second netlist if the FIB in the third netlist has an equivalent node in the first netlist and exist in the second netlist.

8. The method of claim 7, further comprising:
    connecting unchanged outputs from the third netlist to logic elements from the second netlist; and
    disconnecting output pins from the second netlist.

9. The method of claim 7, further comprising sweeping the second netlist.

10. The method of claim 9, wherein sweeping the second netlist comprises removing unconnected input and output pins.

11. The method of claim 9, wherein sweeping the second netlist comprises removing unconnected FIBs from the second netlist.

12. The method of claim 1, further comprising performing placement and routing after performing optimizations during synthesis in the first compilation.

13. The method of claim 12, further comprising performing optimizations on the changed portion during synthesis in the second compilation using delay information from the placement and routing performed in the first compilation.

14. The method of claim 1, wherein replacing the identical region comprises:
    adding the second netlist to the third netlist;
    duplicating a node in the third netlist and connecting the node to logic it is driving if the node has a structurally identical node from the first netlist and the node is a FIB in the second netlist; and connecting an input of a FIB in the third netlist to an input of a FIB in the second netlist if the FIB in the third netlist has an equivalent node in the first netlist and exist in the second netlist.

15. The method of claim 1, wherein replacing the identical region comprises:
    adding the second netlist to the third netlist; and
    connecting an input of a FIB in the third netlist to an input of a FIB in the second netlist if the FIB in the third netlist has an equivalent node in the first netlist and exist in the second netlist and if a merging node has not changed in the second compilation when the equivalent node in the first netlist is merged with the merging node during the first compilation.

16. The method of claim 1, wherein performing extraction during synthesis comprises creating a structural representation of a system from a high level description.

17. The method of claim 1, wherein performing optimizations during synthesis comprises performing procedures to reduce area and improve speed and performing mapping to create a netlist of logic blocks supported by the target device.

18. A non-transitory computer-readable medium including a sequence of instructions stored thereon for causing a computer to execute a method, the method comprising:
    generating a first netlist with a first set of functionally invariant boundaries (FIBs) after performing extraction during synthesis of a first version of a system in a first compilation;

invalidating one or more of the FIBs from the first set after performing optimizations during synthesis in the first compilation resulting in a second netlist with a second set of FIBs;

generating a third netlist with a third set of FIBs after performing extraction during synthesis of a second version of the system having a changed portion in a second compilation;

traversing connectivity of matching nodes from the first netlist and the third netlist reaching FIBs to identify equivalent nodes associated with identical regions; and replacing the identical region in the third netlist with an optimized synthesized region from the second netlist.

19. The non-transitory computer-readable medium of claim 18, wherein the method further comprises:
constructing hash values of nodes in the first netlist and the second netlist based on the nodes name, type, and connectivity; and
using the hash values to identify matching nodes.

20. The non-transitory computer-readable medium of claim 18, wherein traversing connectivity of matching nodes from the first netlist and the third netlist reaching FIBs to identify equivalent nodes associated with identical regions comprises comparing inputs of candidate matches reaching a FIB to identifying an identical region.

21. The non-transitory computer-readable medium of claim 18, wherein replacing the identical region comprises:
adding the second netlist to the third netlist; and
connecting an input of a FIB in the third netlist to an input of a FIB in the second netlist if the FIB in the third netlist has an equivalent node in the first netlist and exist in the second netlist.

22. The non-transitory computer readable medium of claim 21, the method further comprising:
connecting unchanged outputs from the third netlist to logic elements from the second netlist; and
disconnecting output pins from the second netlist.

23. The non-transitory computer-readable medium of claim 21, the method further comprising sweeping the second netlist.

24. The non-transitory computer-readable medium of claim 23, wherein sweeping the second netlist comprises removing unconnected input and output pins.

25. The non-transitory computer readable medium of claim 23, wherein sweeping the second netlist comprises removing unconnected FIBs from the second netlist.

26. The non-transitory computer-readable medium of claim 18, the method further comprising generating a mapping between the first set of FIBs and the second set of FIBs.

27. A system designer, comprising:
a synthesis unit operable to generate a first netlist with a first set of functionally invariant boundaries (FIBs) after performing extraction of a first version of the system in a first compilation, invalidate one or more of the FIBs from the first set after performing optimizations in the first compilation resulting in a second netlist with a second set of FIBs, and generate a third netlist with a third set of FIBs after performing extraction of a second version of the system having a changed portion in a second compilation;
a differentiation unit operable to traverse connectivity of matching nodes from the first netlist and the third netlist reaching FIBs to identify equivalent nodes associated with identical regions; and
a replacement unit operable to replace the identical regions in the third netlist with an optimized synthesized region from the second netlist.

28. The system designer of claim 27, wherein all nodes in the first netlist are FIBs.

29. The system designer of claim 27, wherein a FIB is invalidated after performing optimizations when an optimization is performed on the FIB or across the FIB.

30. The system designer of claim 27, wherein the differentiation unit is operable to compare inputs of matching nodes reaching a FIB to identify the identical region.

31. The system designer of claim 27, wherein the replacement unit adds the second netlist to the third netlist, and connects an input of a FIB in the third netlist to an output of synthesized logic in the second netlist if the FIB in the third netlist has an equivalent node in the first netlist and exist in the second netlist.

32. The system designer of claim 27, wherein the replacement unit further
connects unchanged outputs from the third netlist to logic elements from the second netlist, and disconnects output pins from the second netlist.

33. The system designer of claim 27, wherein the replacement unit adds the second netlist to the third netlist, duplicates a node in the third netlist and connects the node to logic it is driving if the node has a structurally identical node from the first netlist and the node is a FIB in the second netlist, and connects an input of a FIB in the third netlist to an input of a FIB in the second netlist if the FIB in the third netlist has an equivalent node in the first netlist and exist in the second netlist.

34. The system designer of claim 27, further comprising:
a placement unit to place the first version of the system on the target device; and
a router to route the first version of the system on the target device.

35. The system designer of claim 27, wherein the synthesis unit performs optimizations on the changed portion of the second version of the system during synthesis in the second compilation by using timing information from placement and routing of the first version of the system.

* * * * *